US012589655B2

(12) United States Patent
Terasawa et al.

(10) Patent No.: US 12,589,655 B2
(45) Date of Patent: Mar. 31, 2026

(54) BATTERY MANAGEMENT SYSTEM AND VEHICLE

(71) Applicant: TOYOTA JIDOSHA KABUSHIKI KAISHA, Toyota (JP)

(72) Inventors: Yuko Terasawa, Meguro-ku (JP);
Makoto Kakuchi, Toyota (JP);
Toshiaki Karasawa, Adachi-ku (JP);
Takeshi Higashi, Nagoya (JP);
Yoshihiko Endo, Minato-ku (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 73 days.

(21) Appl. No.: 18/390,810

(22) Filed: Dec. 20, 2023

(65) Prior Publication Data

US 2024/0208334 A1 Jun. 27, 2024

(30) Foreign Application Priority Data

Dec. 27, 2022 (JP) ................................. 2022-210080

(51) Int. Cl.
| | |
|---|---|
| *B60L 3/00* | (2019.01) |
| *B60L 53/80* | (2019.01) |
| *B60L 58/16* | (2019.01) |
| *G01R 31/36* | (2020.01) |
| *G01R 31/367* | (2019.01) |
| *G01R 31/392* | (2019.01) |
| *G07C 5/08* | (2006.01) |
| *H01M 10/42* | (2006.01) |

(52) U.S. Cl.
CPC ............. *B60L 3/0046* (2013.01); *B60L 53/80* (2019.02); *B60L 58/16* (2019.02); *G01R 31/367* (2019.01); *G01R 31/392* (2019.01);

*G07C 5/0816* (2013.01); *H01M 10/425* (2013.01); *H01M 2010/4271* (2013.01); *H01M 2220/20* (2013.01)

(58) Field of Classification Search
CPC ........ B60L 3/0046; B60L 53/80; B60L 58/16; B60L 58/10; B60L 2240/54; G01R 31/367; G01R 31/392; G07C 5/0816; H01M 10/425; H01M 2010/4271; H01M 2220/20
See application file for complete search history.

(56) References Cited

U.S. PATENT DOCUMENTS

| | | | |
|---|---|---|---|
| 2017/0261473 A1* | 9/2017 | Sung .................. | G01N 29/4481 |
| 2021/0318388 A1* | 10/2021 | Bae ...................... | G01R 31/392 |
| 2022/0111812 A1 | 4/2022 | Murakami | |

FOREIGN PATENT DOCUMENTS

JP 2022-064527 A 4/2022

* cited by examiner

*Primary Examiner* — Rodney A Butler
(74) *Attorney, Agent, or Firm* — Sughrue Mion, PLLC

(57) ABSTRACT

A battery management system is a system for managing a battery that is mounted on a vehicle capable of traveling with electric power and stores the electric power, and includes: an identification unit that identifies a degree of degradation of the battery before and after an accident of the vehicle; and a processing unit that executes a specific process for the battery in accordance with the degree of degradation identified by the identification unit. An action can be taken in accordance with the degree of degradation of the battery due to an accident such as collision.

2 Claims, 4 Drawing Sheets

BATTERY MANAGEMENT SYSTEM AND VEHICLE

CROSS REFERENCE TO RELATED APPLICATIONS

This nonprovisional application is based on Japanese Patent Application No. 2022-210080 filed on Dec. 27, 2022 with the Japan Patent Office, the entire contents of which are hereby incorporated by reference.

BACKGROUND

Field

The present disclosure relates to a battery management system and a vehicle, and more particularly, to a battery management system for managing a battery that is mounted on a vehicle capable of traveling using electric power and stores the electric power, and to a vehicle capable of traveling using the electric power.

Description of the Background Art

Conventionally, when an electrically powered vehicle is subjected to an impact like a collision accident (the term "collision" used herein may also refer to "crash"), control of lowering the voltage of a traveling battery to a specified voltage or lower is performed (see, for example, paragraph [0002] of Japanese Patent Laying-Open No. 2022-064527).

SUMMARY

A battery may be degraded due to an external factor such as collision accident as disclosed in Japanese Patent Laying-Open No. 2022-064527. In this case, it is desirable to take an action in accordance with degradation of the battery.

The present disclosure is made to solve such a problem, and an object of the present disclosure is to provide a battery management system and a vehicle that enables an action to be taken in accordance with degradation of the battery due to an accident such as collision.

A battery management system according to the present disclosure is a system for managing a battery that is mounted on a vehicle capable of traveling with electric power and stores the electric power. The battery management system includes: an identification unit that identifies a degree of degradation of the battery before and after an accident of the vehicle; and a processing unit that executes a specific process for the battery in accordance with the degree of degradation identified by the identification unit.

With such a configuration, the battery management system executes a specific process for the battery, in accordance with the degree of degradation of the battery before and after an accident of the vehicle. Accordingly, the battery management system can be provided that can take an action in accordance with the degradation of the battery due to an accident such as collision.

The processing unit may execute, as the specific process, a process for ensuring safety of the vehicle, when the degree of degradation is more than or equal to a predetermined value.

With such a configuration, the battery management system executes a process for ensuring safety of the vehicle, when the degree of degradation of the battery before and after an accident of the vehicle is more than or equal to a predetermined value. Accordingly, it is possible to ensure safety of the vehicle, in accordance with the degradation of the battery due to an accident such as collision.

The processing unit may execute, as the specific process, a process for causing the battery to be replaced, when the degree of degradation falls in a predetermined range less than a predetermined value.

With such a configuration, the battery management system executes a process for causing the battery to be replaced, when the degree of degradation of the battery before and after an accident of the vehicle falls in a predetermined range less than a predetermined value. Accordingly, it is possible to replace the battery, in accordance with the degradation of the battery due to an accident such as collision.

The processing unit may cancel execution of the specific process, when the battery is degraded and the processing unit detects replacement of the battery.

With such a configuration, the battery management system executes a specific process for the battery, in accordance with an increase rate of the battery internal resistance or a decrease of the battery capacity retention ratio, before and after an accident of the vehicle. Accordingly, it is possible to take an action in accordance with the increase rate of the battery internal resistance or the decrease of the battery capacity retention ratio due to an accident such as collision.

According to another aspect of the present disclosure, a vehicle capable of traveling with electric power is provided, and the vehicle includes: a battery that stores the electric power; an identification unit that identifies a degree of degradation of the battery before and after an accident; and a processing unit that executes a specific process for the battery in accordance with the degree of degradation identified by the identification unit.

With such a configuration, it is possible to provide a vehicle for which an action can be taken in accordance with degradation of the battery due to an accident such as collision.

The foregoing and other objects, features, aspects and advantages of the present disclosure will become more apparent from the following detailed description of the present disclosure when taken in conjunction with the accompanying drawings.

DESCRIPTION OF THE PREFERRED EMBODIMENTS

Figure 1:
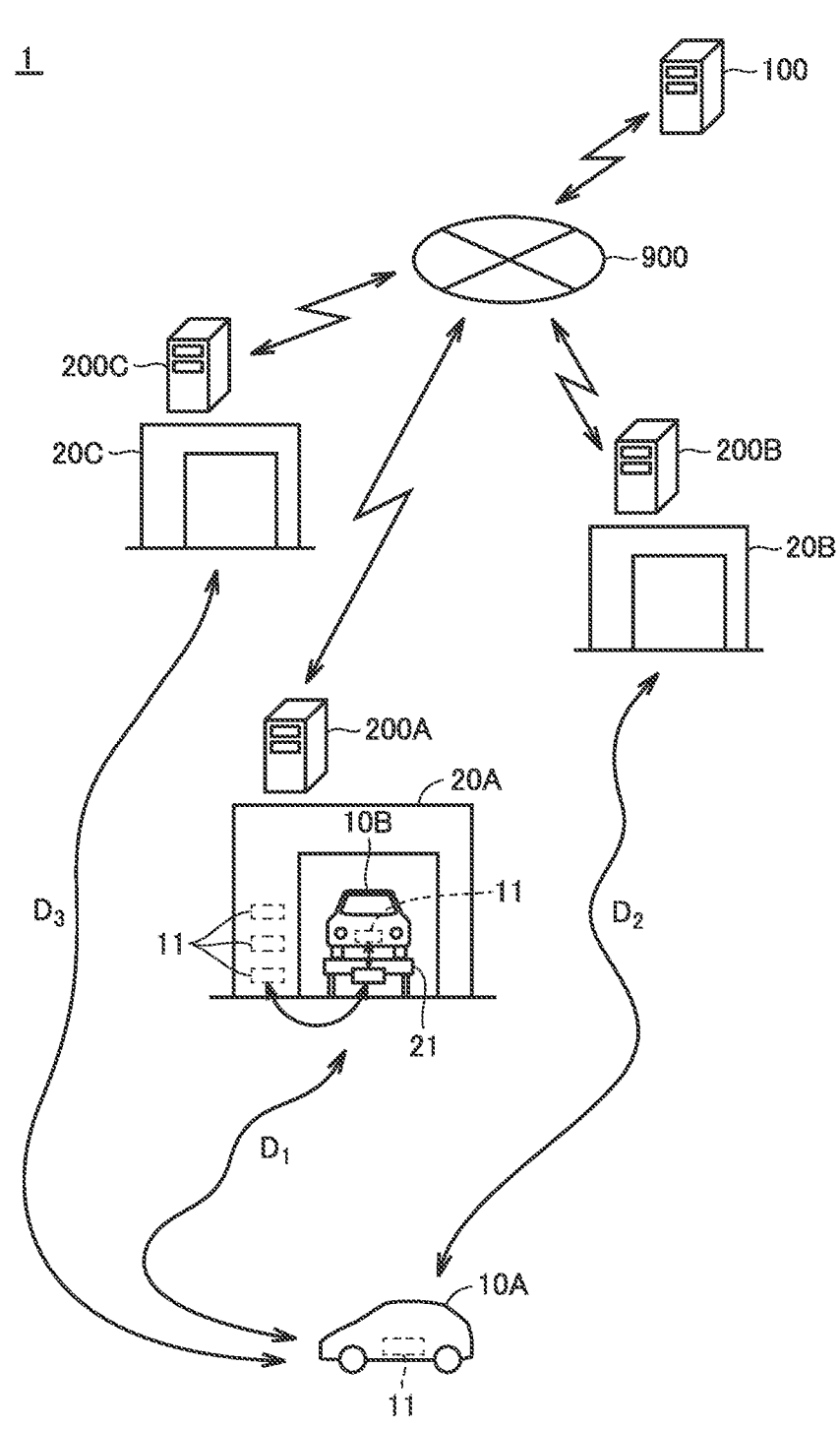
FIG. 1 is a diagram showing a configuration of a battery management system according to this embodiment.

Hereinafter, embodiments of the present disclosure will be described in detail with reference to the accompanying drawings. In the drawings, the same or corresponding parts are denoted by the same reference numerals, and the description thereof will not be repeated.

First Embodiment

Figure 2:
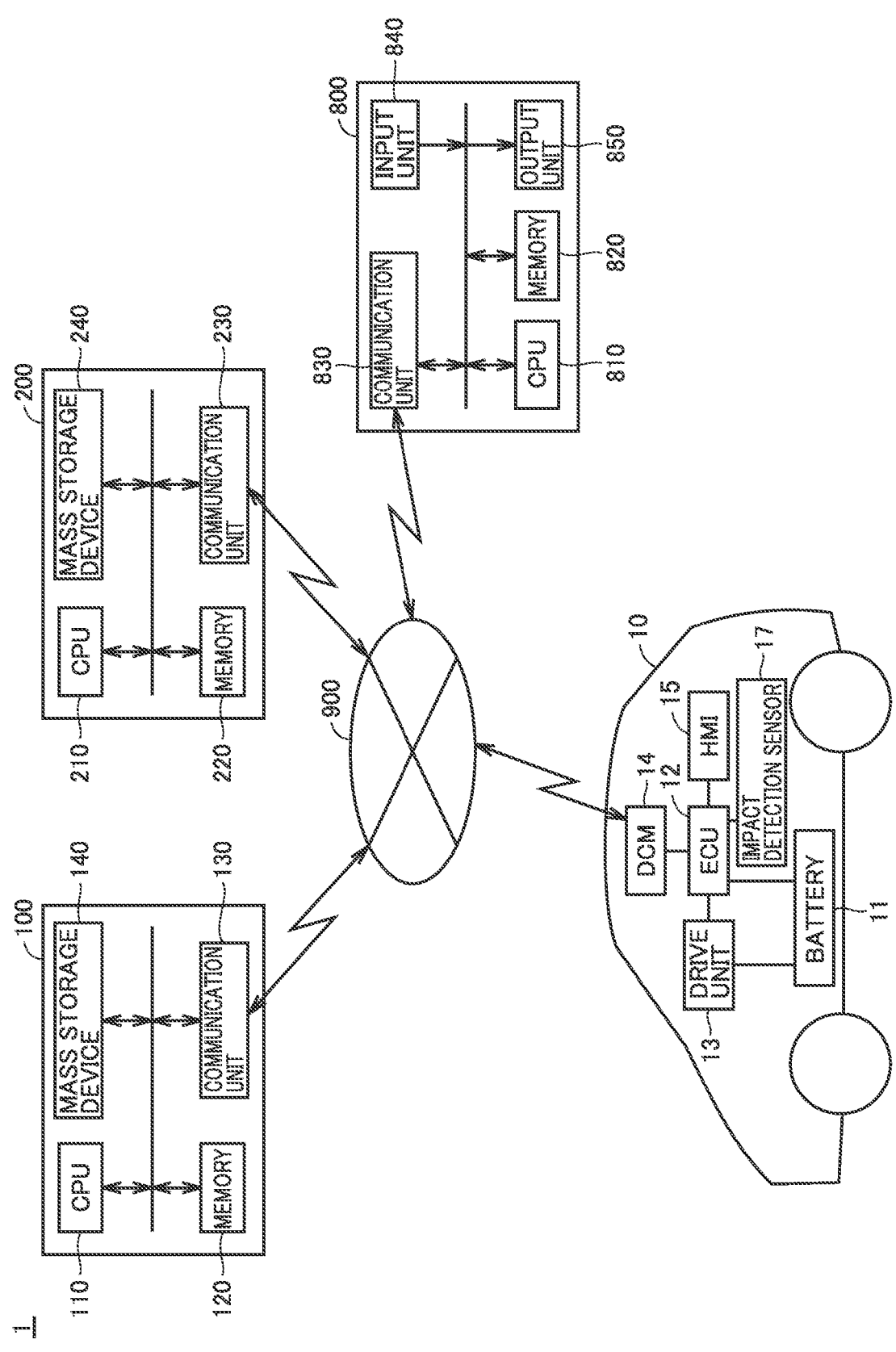
FIG. 2 is a block diagram schematically showing the configuration of each device included in the battery management system according to the embodiment.

FIG. 1 is a diagram showing a configuration of a battery management system 1 according to this embodiment. FIG. 2 is a block diagram showing an outline of a configuration of each device included in the battery management system 1 of this embodiment. Referring to FIGS. 1 and 2, the battery management system 1 includes a plurality of vehicles 10A and 10B (hereinafter, the vehicle 10 will be representatively referred to as "vehicle 10"), a plurality of replacement stations 20A to 20C, facility servers 200A to 200C (hereinafter, also referred to as "equipment server 200") provided in each of the replacement stations 20A to 20C (hereinafter, also referred to as "replacement station 20"), and a management server 100. The battery management system 1 may include a mobile terminal 800 possessed by a user of the vehicle 10. The vehicles 10A and 10B, the facility servers 200A to 200C, the management server 100, and the mobile terminal 800 can communicate via the communication network 900.

The vehicle 10 includes a battery 11, ECU (Electronic Control Unit) 12, a drive unit 13, DCM (Data Communication Module) 14, HMI (Human Machine Interface) 15, and an impact detection sensor 17. The battery 11 stores electric power used for traveling the vehicle 10 and is mounted on the vehicle 10 so as to be replaceable by a replacement apparatus 21 described later. The battery 11 is, for example, a lithium ion battery. However, the present disclosure is not limited thereto, and the battery 11 may be composed of other types of batteries, for example, a nickel-hydrogen battery or an all-solid-state battery.

The ECU 12 includes a CPU (Central Processing Unit), a memory, and GPS (Global Positioning System). The memory includes a random access memory (RAM) and a read only memory (ROM), and stores programs and data used by the CPU. The CPU executes predetermined processing defined by the program in accordance with the program and data stored in the memory and data input from the outside, and stores the execution result data in the memory or outputs the execution result data to the outside. The GPS detects positional information of the vehicle 10 and transfers the positional information to the CPU.

The drive unit 13 includes a motor generator and an inverter that drives the motor generator using power of the battery 11 and charges regenerative power generated by the motor generator to the battery 11. The drive unit 13 may further include an engine that drives the motor generator or the vehicle 10 by operating with fuel. That is, the vehicle 10 may be an electric vehicle (BEV: Battery Electric Vehicle) including a motor generator and not including an engine, or may be a hybrid vehicle (HEV: Hybrid Electric Vehicle) or a plug-in hybrid vehicle (PHEV: Plug-in Hybrid Electric Vehicle) including a motor generator and an engine. The vehicle 10 may be a fuel cell vehicle (FCEV: Fuel Cell Electric Vehicle).

The DCM 14 is a module for communicating with an external device via a communication network 900. The DCM 14 transmits data from the ECU 12 to an external device, and transfers data from the external device to the ECU 12.

The HMI 15 is provided in the vicinity of the driver's seat of the vehicle 10, receives information inputted by the user, and outputs the information to the ECU 12. The HMI 15 displays or sounds information from the ECU 12 to the user. The HMI 15 includes, for example, a touch panel display.

The impact detection sensor 17 includes an acceleration sensor, and outputs a signal indicating acceleration in three axial directions generated in the vehicle 10 to the ECU 12. The ECU 12 identifies the acceleration in three axial directions from a signal input from the impact detection sensor 17. The ECU 12 identifies the impact force on the vehicle 10 from the change in acceleration. The ECU 12 determines whether or not an external force due to a collision with the vehicle 10 or a vignetting of an incoming object is applied to the vehicle 10 depending on the magnitude of the impact force.

The facility server 200 includes a CPU 210, a memory 220, a communication unit 230, and a mass storage device 240. The memory 220 includes a random access memory (RAM) and a read only memory (ROM). The communication unit 230 can communicate with an external device via the communication network 900. The communication unit 230 transmits data from the CPU 210 to an external device. The communication unit 230 transfers data from an external device to the CPU 210. The mass storage device 240 is configured by an HDD (Hard Disk Drive), SSD (Solid State Drive), or the like, and stores programs and data used by the CPU 210. The CPU 210 executes a predetermined process defined by the program in accordance with a program and data stored in the memory 220 or the mass storage device 240 and data input from an external device to the communication unit 230. The CPU 210 stores the execution result data in the memory 220 or the mass storage device 240 or outputs the execution result data from the communication unit 230 to an external device.

The replacement station 20 of the battery 11 includes a replacement apparatus 21 and a facility server 200. The replacement apparatus 21 is controlled by the facility server 200, and operates as follows. The replacement apparatus 21 removes the battery 11 of the vehicle 10 from the vehicle 10. The replacement apparatus 21 moves the removed battery 11 to a storage location. The replacement apparatus 21 starts charging the moved battery 11. The replacement apparatus 21 takes out the charged battery 11 from the storage location. The replacement apparatus 21 mounts the taken-out battery 11 to the vehicle 10. In this embodiment, after booking for replacement of the battery 11 is entered, the battery 11 charged to the SOC (State Of Charge)=80% is charged to the SOC of full charge=100%.

The management server 100 includes a CPU 110, a memory 120, a communication unit 130, and a mass storage device 140. The management server 100 manages the status of the battery 11 of the vehicle 10. For example, the management server 100 assigns an identification number to each of the plurality of batteries 11. The management server 100 manages the location (Which vehicle 10 is mounted or which replacement station 20 is stored.) of the battery 11 and the insurance status of the battery 11 in association with the identification number for each battery 11. The functions of the CPU 110, the memory 120, the communication unit 130, and the mass storage device 140 of the management server 100 are the same as those of the CPU 210, the memory 220, the communication unit 230, and the mass storage device 240 of the facility server 200, respectively.

The mobile terminal 800 includes a CPU 810, a memory 820, a communication unit 830, an input unit 840, and an output unit 850. The functions of the memory 820 and the communication unit 830 of the mobile terminal 800 are the same as those of the memory 220 and the communication unit 230 of the facility server 200, respectively. The input unit 840 includes a touch panel, operation buttons, and a microphone. The input unit 840 transfers data input from a touch panel, operation buttons, or a microphone to the CPU 810. The output unit 850 includes a display and a speaker. The output unit 850 outputs data from the CPU 810 from a display or a speaker. The CPU 810 executes a predetermined process defined by the program according to the program and data stored in the memory 820, the data input from the external device to the communication unit 830, and the data input from the input unit 840. The CPU 810 stores the execution result data in the memory 820, outputs the execution result data to an external device from the communication unit 830, or outputs the execution result data from the output unit 850.

In the battery management system 1 described above, the battery may deteriorate due to external factors such as collision accidents. In this case, it is desirable to take measures corresponding to the degradation of the battery.

Accordingly, the battery management system 1 identifies the degree of degradation of the battery 11 before and after the accident of the vehicle 10, and executes the specific process for the battery 11 in accordance with to the identified degree of degradation.

As a result, the battery management system 1 executes the specific process for the battery 11 in accordance with the degree of degradation of the battery 11 before and after the accident of the vehicle 10. As a result, it is possible to deal with the degradation of the battery 11 due to an accident such as a collision.

Figure 3:
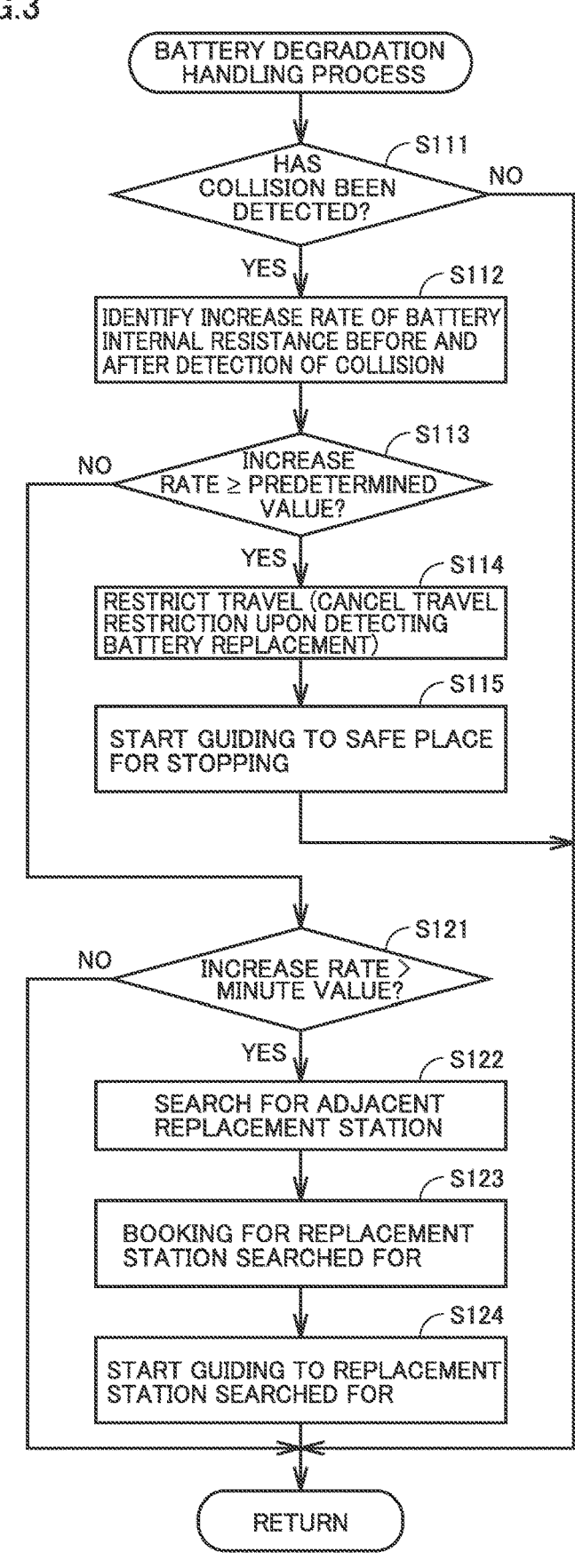
FIG. 3 is a flowchart showing a flow of a battery degradation handling process according to the first embodiment.

FIG. 3 is a flowchart showing a flow of a battery degradation handling process according to the first embodiment. Referring to FIG. 3, this battery degradation handling process is called and executed by ECU 12 of vehicle 10 at regular intervals (for example, a regular interval between several ms and several tens of ms) from a higher-order process.

The ECU 12 of the vehicle 10 determines whether or not an external force caused by a collision accident, a human body accident, a physical loss accident, a self-loss accident, a wheel-falling accident, a fall-over accident, a visitor accident, or the like has been detected in the vehicle 10 based on a signal from the impact detection sensor 17 (step S111). When it is determined that the external force due to a collision accident or the like is not detected (NO in step S111), the ECU 12 returns the processing to be executed to the higher-level processing of the calling source of the battery degradation handling process.

On the other hand, when it is determined that the external force caused by a collision accident or the like is detected (YES in step S111), the ECU 12 identifies the increase rate in the internal resistance of the battery 11 before and after the detection of the external force caused by the collision accident or the like (step S112). The ECU 12 periodically identifies the internal resistance of the battery 11, and stores the value of the internal resistance in the memory. When the ECU 12 detects the external force, the ECU 12 can calculate the increase rate of the internal resistance by identifying the internal resistance and subtracting the internal resistance before detection of the external force stored in the memory from the identified internal resistance.

The ECU 12 determines whether or not the increase rate calculated in step S112 is equal to or greater than a predetermined value (step S113). The predetermined value is a threshold value of an increase rate of the internal resistance for determining whether or not rapid degradation has occurred in the battery 11. When the increase rate of the internal resistance is equal to or greater than the predetermined value, it is determined that rapid degradation has occurred in the battery 11. When the increase rate of the internal resistance is less than the predetermined value, it is determined that the battery 11 has no rapid degradation.

When it is determined that the increase rate of the internal resistance is equal to or greater than the predetermined value (YES in step S113), the ECU 12 controls the drive unit 13 to restrict the travel (step S114). In this embodiment, the travel restriction is such that the speed does not exceed a predetermined upper limit value (e.g., a relatively low slow travel speed such as 30 km per hour). However, the present disclosure is not limited thereto, and the restriction of travel may be such that the travel distance does not exceed a predetermined upper limit value. The restriction may be such that the traveling time from detection of an external force due to a collision accident or the like does not exceed a predetermined upper limit value. The restriction may be that the vehicle 10 is turned on when the power switch is turned off and then turned on. When the ECU 12 detects the replacement of the degraded battery 11, the ECU 12 cancels the travel restriction. In addition to the control in step S114, the ECU 12 may notify the fact that the restriction of travel is released when the battery 11 is replaced by sound or display by the HMI 15.

Then, the ECU 12 starts guidance for stopping the vehicle 10 to a safe place (step S115), and returns the processing to be executed to the higher-level processing of the calling source of the battery degradation handling process. A safe location is a road shoulder or as wide as possible if the road shoulder is narrow. In this embodiment, this guidance is to guide a route with a safe place as a destination on a navigation screen displayed on the HMI 15. However, the guidance is not limited thereto, and may be, for example, guidance by sound or display by the HMI 15 such as "Please approach the shoulder of the road." or "There is a parking lot which can be stopped 100 m ahead.", or may be automated driving up to a safe place when the vehicle 10 is capable of automated driving.

On the other hand, when determining that the increase rate of the internal resistance is less than the predetermined value (NO in step S113), the ECU 12 determines whether or not the increase rate is equal to or greater than the predetermined minute value (that is, a predetermined range in which the increase rate is less than the predetermined value and equal to or greater than the predetermined minute value) (step S121). When the ECU 12 determines that the increase rate is less than the predetermined fine value (NO in step S121), the ECU 12 returns the processing to be executed to the higher-level processing of the calling source of the battery degradation handling process.

On the other hand, when the increase rate is equal to or greater than the predetermined minute value (YES in step S121), that is, when the increase rate is determined to be within the predetermined range, the ECU 12 searches for the replacement station 20 adjacent to the current position of the vehicle 10 (step S122), and executes a process for booking for replacement of the battery 11 in the retrieved replacement station 20 (step S123). Then, the ECU 12 starts guidance to the retrieved replacement station 20 (step S124), and returns the processing to be executed to the higher-level processing of the calling source of the battery degradation handling process. In this embodiment, this guidance is based on the navigation screen displayed on the HMI 15 to guide a route with the retrieved replacement station 20 as a destination. However, the guidance is not limited thereto, and may be automated driving up to the retrieved replacement station 20 when the vehicle 10 is capable of automated driving.

Second Embodiment

In the first embodiment, when an external force caused by a collision accident or the like is detected, the vehicle 10 executes the specific process on the battery 11 according to the degree of degradation of the battery 11 before and after the accident of the vehicle 10. In the second embodiment, the identification process is executed by the battery management system 1 including the vehicle 10 and the management server 100.

Figure 4:
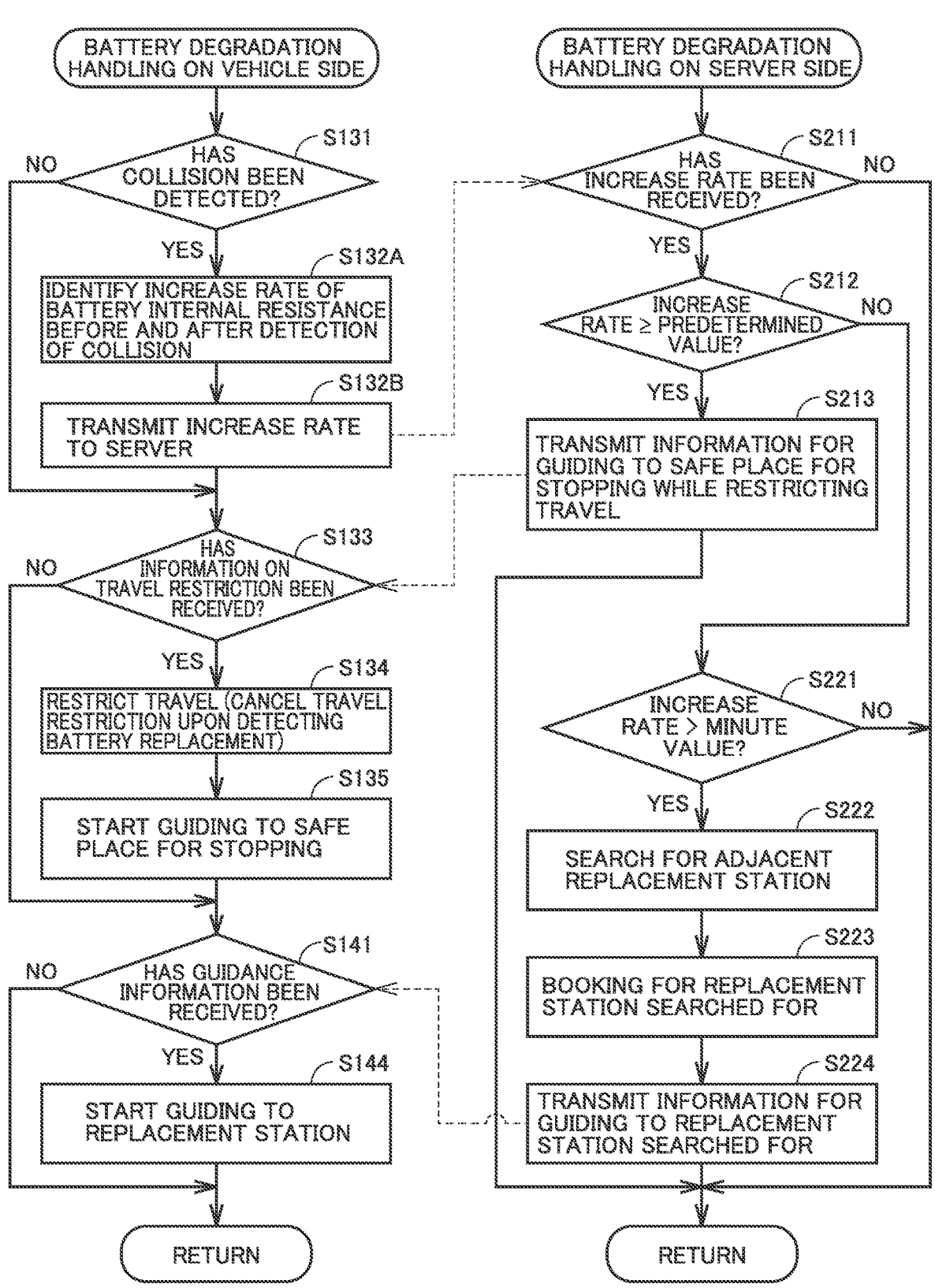
FIG. 4 is a flowchart showing a flow of a battery degradation handling process according to the second embodiment.

FIG. 4 is a flowchart showing a flow of a battery degradation handling process according to the second embodiment. Referring to FIG. 4, of the battery degradation handling process, the battery degradation handling vehicle side process is called and executed every certain period (for example, a certain period between several ms and several tens of ms) from the higher-level process by ECU 12 of vehicle 10. Among the battery degradation handling processes, the battery degradation handling server side process is called and executed by the CPU 110 of the management server 100 from the higher-level process at predetermined intervals.

The ECU 12 of the vehicle 10 determines whether or not an external force caused by a collision accident, a human body accident, a physical loss accident, a self-failure accident, a wheel-falling accident, a fall-falling accident, or the like has been detected in the vehicle 10 based on a signal from the impact detection sensor 17 (step S131). When it is determined that an external force due to a collision accident or the like is not detected (NO in step S131), the ECU 12 advances the processing to be executed to step S133.

On the other hand, when it is determined that the external force due to a collision accident or the like has been detected (YES in step S131), the ECU 12 identifies the increase rate of the internal resistance of the battery 11 before and after the detection of the external force due to the collision accident or the like (step S132A), similarly to step S112 in FIG. 3. The ECU 12 controls the DCM 14 to transmit the increase rate to the management server 100 (step S132B), and proceeds to step S133.

In the management server 100, the CPU 110 determines whether or not the increase rate of the internal resistance of the battery 11 is received from the vehicle 10 (step S211). When the CPU 110 determines that the increase rate has not been received (NO in step S211), the CPU 110 returns the processing to be executed to the higher-level processing of the calling source of the battery degradation-compatible server side processing.

On the other hand, when determining that the increase rate has been received (YES in step S211), the CPU 110 determines whether or not the received increase rate is equal to or greater than a predetermined value as in step S113 of FIG. 3 (step S212).

When the CPU 110 determines that the increase rate of the internal resistance is equal to or greater than the predetermined value (YES in step S212), the CPU 110 controls the communication unit 130 to transmit travel restriction information for guiding a stop to a safe place while restricting the travel of the vehicle 10 to the vehicle 10 (step S213), and returns the processing to be executed to the higher-level processing of the calling source of the battery degradation-compatible server side processing.

In the vehicle 10, the ECU 12 determines whether or not the travel restriction information is received from the management server 100 (step S133). When the ECU 12 determines that the reception has not been performed (NO in step S133), the ECU 12 advances the process to be performed to step S141.

On the other hand, when it is determined that the travel restriction information is received (YES in step S133), the ECU 12 controls the drive unit 13 to restrict the travel, similarly to step S114 in FIG. 3 (step S134). When the ECU 12 detects the replacement of the degraded battery 11, the ECU 12 cancels the travel restriction. In this case, when the management server 100 detects the replacement of the battery 11 of the vehicle 10, the management server 100 may transmit information for canceling the restriction of the traveling to the vehicle 10, and the vehicle 10 may cancel the restriction of the traveling in response to reception of the information.

Then, as in step S115 of FIG. 3, the ECU 12 starts guidance for stopping the vehicle 10 to a safe place (step S135), and proceeds to step S141.

When the CPU 110 determines in the management server 100 that the increase rate of the internal resistance is less than a predetermined value (NO in step S212), the CPU 110 determines whether or not the increase rate is equal to or greater than a predetermined minute value (that is, a predetermined range in which the increase rate is less than a predetermined value and equal to or greater than a predetermined minute value) (step S221). When the CPU 110 determines that the increase rate is less than the predetermined fine value (NO in step S221), the CPU 110 returns the processing to be executed to the higher-level processing of the calling source of the battery degradation-compatible server side processing.

On the other hand, when it is determined that the increase rate is equal to or greater than the predetermined minute value (YES in step S221), that is, when it is determined that the increase rate is within the predetermined range, the CPU 110 searches for the replacement station 20 adjacent to the current position of the vehicle 10 (step S222). The CPU 110 executes a process for booking for replacement of the battery 11 in the retrieved replacement station 20 (step S223). Then, the CPU 110 controls the communication unit 130 to transmit guidance information for guiding the vehicle 10 to the retrieved replacement station 20 to the vehicle 10 (step S224), and returns the processing to be executed to the higher-level processing of the calling source of the battery degradation-compatible server side processing.

In the vehicle 10, the ECU 12 determines whether or not the guidance information is received from the management server 100 (step S141). When the ECU 12 determines that the received data is not received (NO in step S141), the ECU 12 returns the processing to be executed to the higher-level processing of the calling source of the battery degradation-compatible vehicle side processing.

On the other hand, when it is determined that the guidance information is received (YES in step S141), the ECU 12 starts guidance to the replacement station 20 indicated by the guidance information (step S144), and returns the processing to be executed to the higher-level processing of the calling source of the battery degradation-compatible vehicle processing, as in step S124 of FIG. 3.

Modified Example (1) In the above-described embodiment, as shown in step S111 of FIG. 3 and step S131 of FIG. 4, it is determined whether or not an external force due to a collision with the vehicle 10 or the like is detected, and when the external force is detected, the processing of step S112 and the processing of step S132A and the subsequent steps are executed, respectively. However, the present disclosure is not limited thereto, and it may be determined whether or not other external factors affecting the degradation of the battery 11, for example, a fire or submergence of the vehicle, are detected, and when the other external factors are detected, the processing in steps S112 and S132A and the subsequent steps may be executed.

(2) In the above-described embodiment, as shown in step S112 of FIG. 3 and step S132A of FIG. 4, the degree of degradation of the battery 11 is determined by the increase rate of the internal resistance. However, the present disclosure is not limited thereto, and the degree of degradation of the battery 11 may be determined by another method. For example, the degradation of the battery 11 may be determined based on the decrease in the capacity retention ratio, or may be determined based on the presence or absence of external damage (e.g., damage to the bus bar or liquid leakage). The capacity retention ratio represents the ratio of the current capacity to the capacity of the battery 11 in the initial state (non-degradation state), for example, in the range of 0 to 100%. The capacity of the battery 11 corresponds to the charge amount in the fully charged state.

(3) The above-described embodiments can be regarded as disclosure of the battery management system 1, the vehicle 10 or the management server 100, and disclosure of a method or a program for managing the battery 11 executed by the battery management system 1, the vehicle 10 or the management server 100.

Summary (1) As shown in FIGS. 1 to 4, the battery management system 1 is a system for managing a battery 11 that is mounted on a vehicle 10 capable of traveling with electric power and stores the electric power. The battery management system 1 includes: an identification unit that identifies a degree of degradation of the battery 11 before and after an accident of the vehicle 10 (for example, the impact detection sensor 17 of the vehicle 10 that detects and thereby identifies the degree of degradation, the ECU 12 of the vehicle 10 that obtains the degree of degradation from the impact detection sensor 17 and thereby identifies the degree of degradation, the communication unit 130 and the CPU 110 of the management server 100 that obtains the degree of degradation from the vehicle 10 and thereby identifies the degree of degradation, step S112 in FIG. 3, steps S132A, S132B and S211 in FIG. 4); and a processing unit that executes a specific process for the battery 11 in accordance with the degree of degradation identified by the identification unit (for example, the ECU 12 of the vehicle 10, the CPU 110 of the management server 100, steps S114, S115, and S122 to S124 in FIG. 3, and steps S213, S134, S135, S222 to S224, and S144 in FIG. 4).

Thus, the battery management system 1 executes the specific process for the battery 11 in accordance with the degree of degradation of the battery 11 before and after an accident of the vehicle 10. As a result, it is possible to take an action in accordance with the degradation of the battery due to an accident such as collision.

(2) As shown in FIGS. 3 and 4, the processing unit may perform, as the specific process, a process for ensuring safety of the vehicle, when the degree of degradation is more than or equal to a predetermined value (for example, steps S114 and S115 in FIG. 3 and steps S134 and S135 in FIG. 4).

Thus, the battery management system 1 executes a process for ensuring safety of the vehicle 10, when the degree of degradation of the battery 11 before and after an accident of the vehicle 10 is more than or equal to a predetermined value. As a result, safety of the vehicle 10 can be ensured in accordance with degradation of the battery 11 due to an accident such as a collision.

(3) As shown in FIGS. 3 and 4, the processing unit may execute, as the specific process, a process for causing the battery 11 to be replaced, when the degree of degradation falls within a predetermined range less than a predetermined value (for example, steps S122 to S124 in FIG. 3, and steps S222 to S224 and S144 in FIG. 4).

Thus, the battery management system 1 executes a process for replacing the battery 11 when the degree of degradation of the battery 11 before and after an accident of the vehicle 10 is within a predetermined range less than a predetermined value. As a result, the battery 11 can be replaced in accordance with degradation of the battery 11 due to an accident such as a collision.

(4) As shown in FIGS. 3 and 4, the processing unit may cancel execution of the specific process, when the battery is degraded and the processing unit detects replacement of the battery (for example, step S114 in FIG. 3 and step S134 in FIG. 4).

Thus, the battery management system 1 executes the specific process for the battery 11, in accordance with the increase rate of the internal resistance of the battery 11, or the decrease of the capacity retention ratio of the battery 11, before and after an accident of the vehicle 10. As a result, it is possible to take an action in accordance with the increase rate of the internal resistance or the decrease of the capacity retention ratio of the battery 11 due to an accident such as collision.

Although the present disclosure has been described and illustrated in detail, it is clearly understood that the same is by way of illustration and example only and is not to be taken by way of limitation, the scope of the present disclosure being interpreted by the terms of the appended claims.

What is claimed is:

1. A battery management system for managing a battery that stores electric power and is mounted on a vehicle capable of traveling with electric power, the battery management system comprising:

an impact detection sensor mounted on the vehicle;

an electronic control unit including a processor and a memory, configured to:

determine whether an external force to the vehicle has been detected based on a signal from the impact detection sensor, based upon the determination the external force has been detected, identify a degree of degradation of the battery before and after the detection of the external force; and execute a specific process for the battery in accordance with the degree of degradation, wherein the electronic control unit includes a first electronic control unit and a second electronic control unit, wherein the first electronic control unit is provided in a management server and the second electronic control unit is provided in the vehicle, wherein the first electronic control unit is configured to periodically obtain and store the internal resistance of the battery, the first electronic control unit is configured to determine the degree of degradation of the battery before and after the detection of the external force based on an increase rate of the internal resistance of the battery obtained before and after the detection of the external force, the first electronic control unit is configured to receive the increase rate from the second electronic control unit and determine whether the increase rate is more than or equal to a predetermined value, based on the determination that the increase rate is more than or equal to the predetermined value, transmit information for guiding the vehicle to a stopping location while restricting travel, based on the determination that the increase rate is not more than or equal to the predetermined value, determine whether the increase rate is more than or equal to a predetermined minute value, wherein the predetermined minute value is less than the predetermined value, and based on the determination that the increase rate is more than or equal to the predetermined minute value, transmit information for guiding the vehicle to a replacement station for replacing the battery.

2. A vehicle capable of traveling with electric power, the vehicle comprising:

a battery that stores the electric power;

an impact detection sensor; and an electronic control unit including a processor and a memory, configured to:

determine whether an external force to the vehicle has been detected based on a signal from the impact detection sensor, based upon the determination the external force has been detected, identify a degree of degradation of the battery before and after the detection of the external force, and execute a specific process for the battery in accordance with the degree of degradation, wherein the electronic control unit is configured to:

periodically obtain and store the internal resistance of the battery, determine the degree of degradation of the battery before and after the detection of the external force based on an increase rate of the internal resistance of the battery obtained before and after the detection of the external force, and transmit the increase rate to a remote server, determine whether a travel restriction has been received from the remote server, and based on receipt of the travel restriction, start guiding the vehicle to a stopping location while restricting travel, determine whether guidance information has been received from the remote server to travel to a replacement station, and based on the determination that the guidance information has been received, start guiding the vehicle to the replacement station.

\* \* \* \* \*